United States Patent
Huang et al.

(10) Patent No.: US 8,791,493 B2
(45) Date of Patent: Jul. 29, 2014

(54) LIGHT EMITTING DIODE PACKAGE AND METHOD FOR MANUFACTURING THE SAME

(71) Applicant: Advanced Optoelectronic Technology, Inc., Hsinchu Hsien (TW)

(72) Inventors: Che-Hsang Huang, Hsinchu (TW); Pin-Chuan Chen, Hsinchu (TW); Lung-Hsin Chen, Hsinchu (TW); Wen-Liang Tseng, Hsinchu (TW); Yu-Liang Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/955,276

(22) Filed: Jul. 31, 2013

(65) Prior Publication Data

US 2014/0084315 A1    Mar. 27, 2014

(30) Foreign Application Priority Data

Sep. 21, 2012    (CN) .......................... 2012 1 0353806

(51) Int. Cl.
*H01L 33/00*    (2010.01)

(52) U.S. Cl.
USPC .............................................. 257/99; 257/88

(58) Field of Classification Search
USPC ....................................................... 257/99, 88
See application file for complete search history.

(56) References Cited

U.S. PATENT DOCUMENTS

2012/0104426 A1 *   5/2012   Chan et al. ...................... 257/89
2013/0301257 A1 *  11/2013   Britt et al. ..................... 362/231

* cited by examiner

*Primary Examiner* — Douglas Menz
(74) *Attorney, Agent, or Firm* — Novak Druce Connolly Bove + Quigg LLP

(57) ABSTRACT

An exemplary light-emitting diode (LED) package includes an electrically insulating substrate, an electrode structure embedded in the insulating substrate, and a plurality of LED chips electrically connecting with the electrodes of the electrode structure respectively. The electrode structure includes a first electrode, a second electrode and a third electrode located between the first and second electrodes. Top surfaces of the first, second and third electrodes are exposed out of a top surface of the insulating substrate to support the LED chips. Bottom surfaces of the first and second electrodes are exposed out of a bottom surface of the substrate to connect with welding pads of a printed circuit board. A bottom surface of the third electrode is received in the substrate.

16 Claims, 9 Drawing Sheets

LIGHT EMITTING DIODE PACKAGE AND METHOD FOR MANUFACTURING THE SAME

BACKGROUND

1. Technical Field

The present disclosure generally relates to solid state light emitting sources and, more particularly, to a light emitting diode (LED) package and a method for manufacturing the LED package.

2. Description of Related Art

LEDs have many advantages, such as high luminosity, low operational voltage, low power consumption, compatibility with integrated circuits, easy driving, long term reliability, and environmental friendliness which have promoted the wide use of LEDs as a light source.

A conventional LED package includes a substrate, a plurality of electrodes arranged on the substrate, a plurality of LED chips mounted on the electrodes and electrically connecting the electrodes respectively. When the LED package is mounted to a printed circuit board, every electrode of the LED package is exposed to electrically connect a corresponding welding pad on the printed circuit board. However, because a distance between two adjacent electrodes is very close, such that, welding solder on the welding pads of the printed circuit board can easily overflow to contaminate each other during the SMT (surface mounting technology) process, thereby resulting in a short circuit of the LED package.

Therefore, what is needed, is an LED package and a method for manufacturing the LED package which can overcome the limitations described above.

DETAILED DESCRIPTION

Embodiments of the LED package and a method for manufacturing the LED package of the present disclosure will now be described in detail below and with reference to the drawings.

Figure 1:
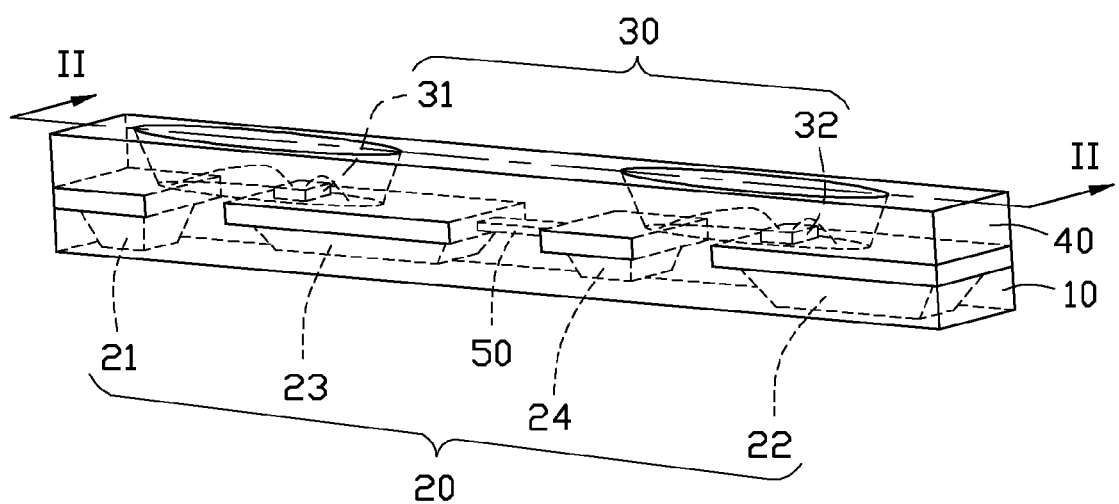
FIG. 1 is a perspective view of an LED package in accordance with a first exemplary embodiment of the present disclosure.
Figure 2:
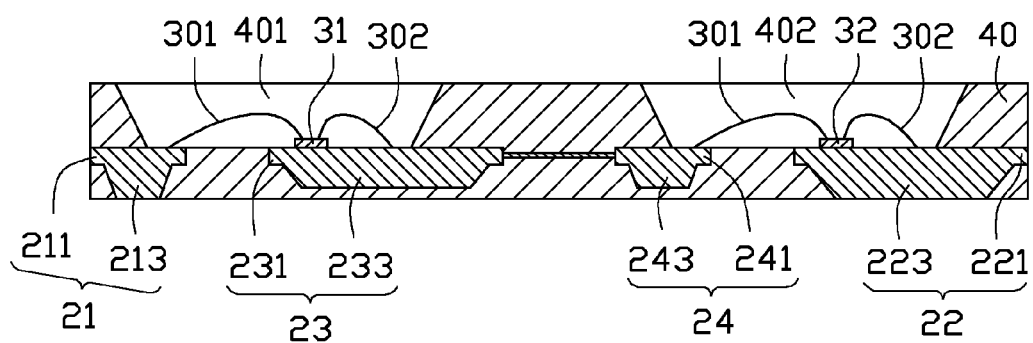
FIG. 2 is a cross-sectional view of the LED package of FIG. 1, taken along line II-II thereof.

Referring to FIGS. 1 and 2, an LED package 100 in accordance with an exemplary embodiment is provided. The LED package 100 includes a substrate 10, an electrode structure 20 embedded in the substrate 10, a plurality of LED chips 30 electrically connecting the electrode structure 20, and a reflector 40 located on the substrate 10 and covering the electrode structure 20 and surrounding the LED chips 30. The substrate 10 is electrically insulating.

The electrode structure 20 includes a first electrode 21, a second electrode 22, a third electrode 23 and a fourth electrode 24. The first electrode 21, the second electrode 22, the third electrode 23, and the fourth electrode 24 are spaced from each other, and are arranged along a longitudinal direction of the LED package 100. The first electrode 21 and the second electrode 22 are located at opposite ends of the substrate 10 along the longitudinal direction. The third electrode 23 and the fourth electrode 24 are successively located between the first electrode 21 and the second electrode 22. In this embodiment, the third electrode 23 and the fourth electrode 24 electrically connect with each other via a connecting bar 50.

In this embodiment, top surfaces of the first, second, third and fourth electrodes 21, 22, 23, 24 are coplanar with a top surface of the substrate 10, and are exposed out of the top surface of the substrate 10. Alternatively, the top surfaces of the first, second, third, fourth electrodes 21, 22, 23, 24 may be coplanar with each other, and above/below the top surface of the substrate 10.

Bottom surfaces of the first and second electrodes 21, 22 are exposed to an outside of the substrate 10 through a bottom of the substrate 10. In this embodiment, bottom surfaces of the first and second electrodes 21, 22 are coplanar with the bottom surface of the substrate 10. The exposed bottom surfaces of the first and second electrodes 21, 22 are used to connect corresponding welding pads on a printed circuit board (not shown). Bottom surfaces of the third electrode 23 and the fourth electrode 24 are located above of the bottom surfaces of the first and second electrodes 21, 22, and are received in the substrate 10. In this embodiment, the bottom surface of the third electrode 23 is coplanar with the bottom surface of the fourth electrode 24.

The first electrode 21 includes a first main portion 211 and a first supporting portion 213 extending downwardly from a central portion of a bottom surface of the first main portion 211, such that a cross-sectional view of the first electrode 21 has an approximately T-shaped configuration. The first main portion 211 is a rectangular board. The first supporting portion 213 has a configuration like an inverted quadrangular frustum, and a size of the first supporting portion 213 is gradually decreased from a top end connecting the bottom surface of the first main portion 211 to bottom end thereof which is away from first main portion 211. A top surface of the first main portion 211 is the top surface of the first electrode 21. A bottom surface of the first supporting portion 213 is the bottom surface of the first electrode 21.

The second electrode 22 has a structure similar to the structure of the first electrode 21, and the second electrode 22 includes a second main portion 221 and a second supporting portion 223. The top surface of the second main portion 221 is the top surface of the second electrode 22, and the bottom surface of the supporting portion 223 is the bottom surface of the second electrode 22.

Similarly, the third electrode 23 includes a third main portion 231 and a third supporting portion 233; and the fourth electrode 24 includes a fourth main portion 241 and a fourth supporting portion 243. The top surfaces of the third and the fourth main portions 231, 241 are the top surfaces of the third and fourth electrodes 23, 24 respectively, and the bottom surfaces of the third and fourth supporting portion 233, 243 are the bottom surfaces of the third and fourth electrodes 23, 24.

The LED chips 30 include a first LED chip 31 and a second LED chip 32. In this embodiment, the first LED chip 31 is located on the top surface of the third main portion 231, and electrically connects the first and third electrodes 21, 23 respectively via wires 301, 302. The second LED chip 32 is located on the top surface of the second main portion 221, and electrically connects with the fourth and second electrode 22, 24 respectively via wires 301, 302. The first LED chip 31 and the second LED chip 32 can radiate light with different colors. Alternatively, the first LED chip 31 can be mounted on the top surface of the first electrode 21, the second LED chip 32 can be mounted on the top surface of the third electrode 23; and the first and second LED chips 31, 32 can radiate light with a same color.

The reflector 40 defines a first through hole 401 and a second through hole 402 therein. The first LED chip 31 is located at the bottom end of the first through hole 401. The second LED chip 32 is located at the bottom end of the second through hole 402. The first LED chip 31 and the second LED chip 32 are surrounded by the reflector 40.

The connecting bar 50 is received in the substrate 10, and is located between the third electrode 23 and the fourth electrode 24. In this embodiment, the connecting bar 50 is made of copper.

Figure 3:
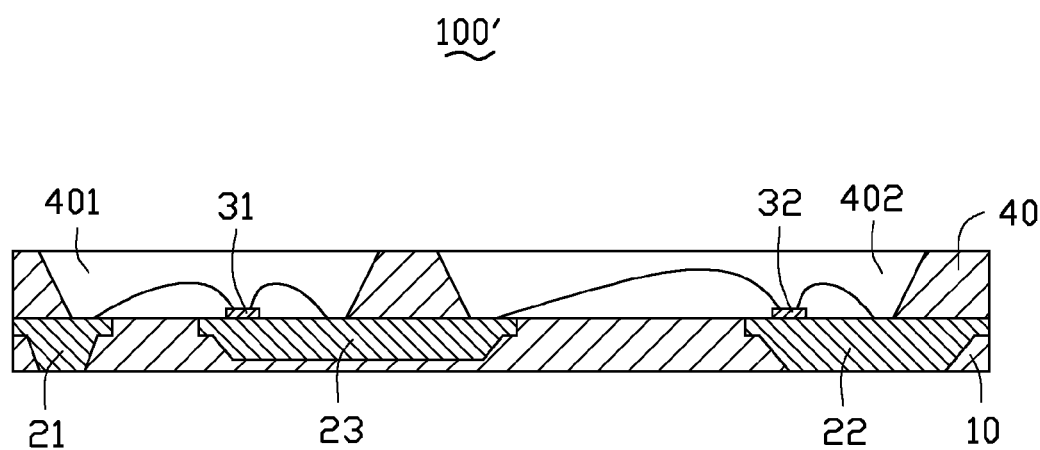
FIG. 3 shows a cross-sectional view of an LED package in accordance with a second exemplary embodiment of the present disclosure.

Referring to FIG. 3, according to a second exemplary embodiment, the LED package 100' includes the first, second and third electrodes 21, 22, 23, the first and second LED chips 31, 32, and the reflector 40.

The first, second and third electrodes 21, 22, 23 are embedded into the substrate 10, and spaced from each other. The electrodes 21, 22, 23 are arranged along the longitudinal direction of the LED package 100'. The third electrode 23 is located between the first and second electrodes 21, 22.

In this embodiment, top surfaces of the first, second and third electrodes 21, 22, 23 are exposed out of the top surface of the substrate 10. In this embodiment, the top surfaces of the first, second and third electrodes 21, 22, 23 are coplanar with the top surface of the substrate 10. Alternatively, the top surfaces of the first, second and third electrodes 21, 22, 23 are coplanar with each other, and are above/below the top surface of the substrate 10.

The bottom surfaces of the first and second electrodes 21, 22 are exposed to an outside of the substrate 10 via a bottom end of the substrate 10. The exposed bottom surfaces of the first and second electrodes 21, 22 are used to connect the corresponding welding pads on a printed circuit board (not shown). The bottom surface of the third electrode 23 is located above the bottom surface of the substrate 10, and is received in the substrate 10. The bottom surfaces of the first and second electrodes 21, 22 are coplanar with the bottom surface of the substrate 10.

The first LED chip 31 is located on the top surface of the third electrode 23 exposed at the bottom end of the first through hole 401, and electrically connects the first and third electrodes 21, 23 via wires 301, 302 respectively. The second LED chip 32 is located on the top surface of the second electrode 22 exposed at the bottom end of the second through hole 402, and electrically connects the second and third electrodes 22, 23 via wires 301, 302 respectively.

According to the LED package 100, 100', because the first electrode 21 and the second electrode 22 are widely separated by the substrate 10 and at least a third electrode 23, the welding pads on a circuit corresponding with the exposed bottom surfaces of the first and second electrodes 21, 22 are widely separated, which decreases the risk of overflow of solder pads corresponding to the first and second electrodes 21, 22 to contaminate each other, which causes the LED package 100 (100') to have a short-circuit. Thus, the reliability and quality of the LED package 100, 100' are improved.

The present disclosure further provides a method for manufacturing the LED package. The method includes following steps.

Figure 4:
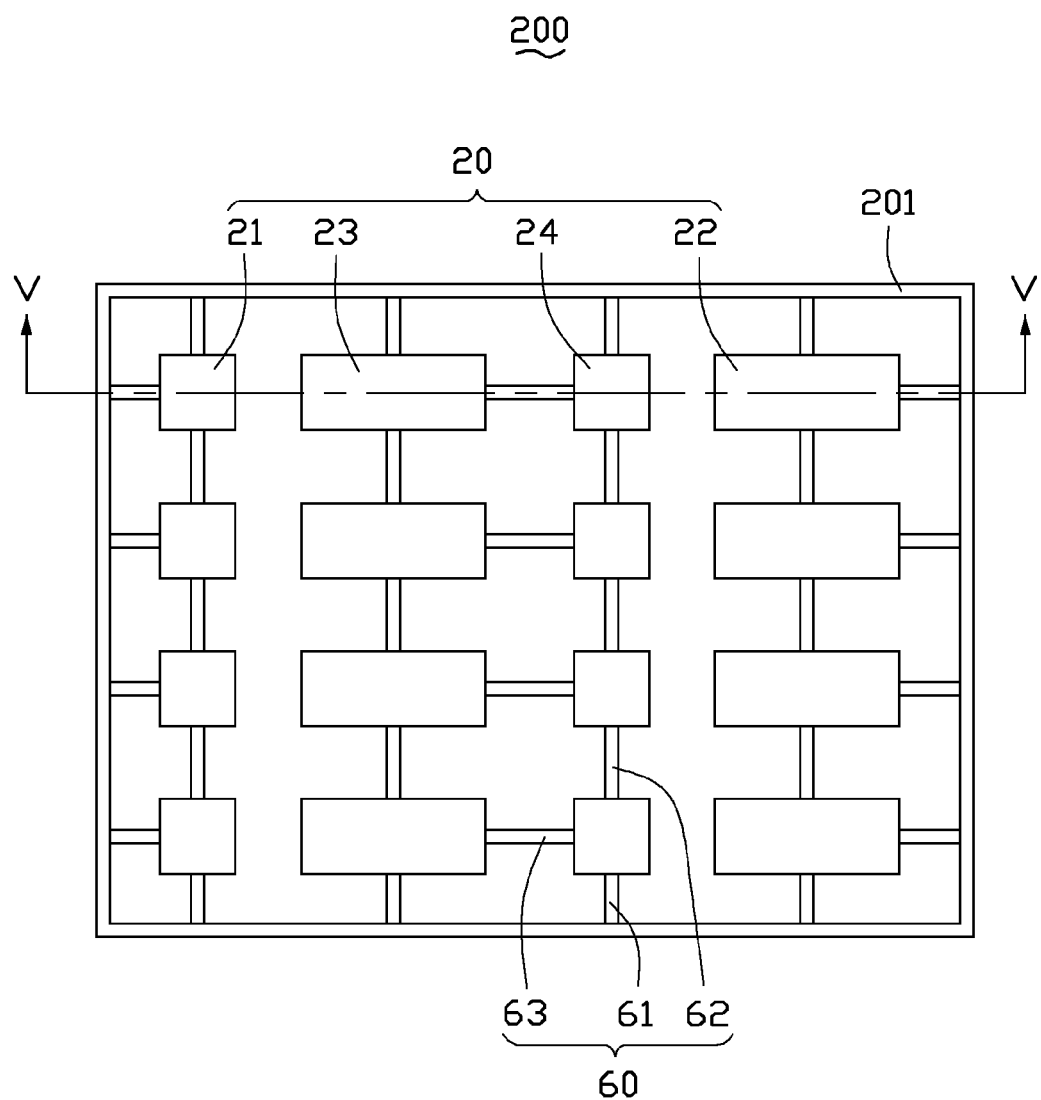
FIGS. 4-9 are schematic views showing steps of a method for manufacturing an LED package of the present disclosure.
Figure 5:
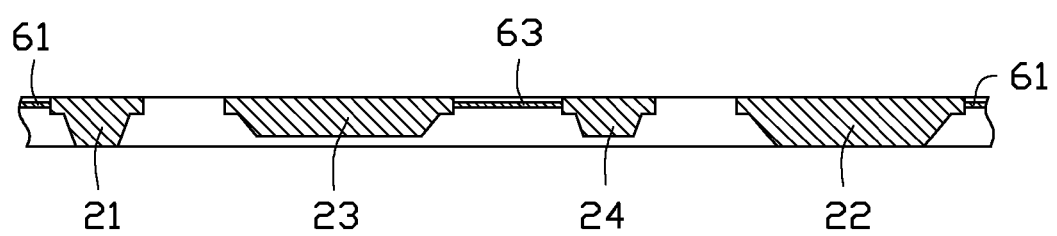

Referring to FIG. 4-5, the first step is providing an engaging frame 200. The engaging frame 200 includes a rectangular lead frame 201, a plurality of electrode structures 20 enclosed by the lead frame 201, and a bracket 60 connecting the electrode structures 20 to the lead frame 201. The lead frame 201 is made of metallic material, such as copper.

In this embodiment, the number of the electrode structures 20 is four. The four electrode structures 20 are arranged in four rows along a top-to-bottom direction of the lead frame 201, as viewed from FIG. 4. The first, second, third and fourth electrodes 21, 22, 23, 24 of the electrode structure 20 are spaced from each other, and are arranged along the longitudinal (left-to-right) direction of the lead frame 201. The third and the fourth electrodes 23, 24 are successively located between the first and second electrode 21, 22.

The bracket 60 includes a plurality of first brackets 61, a plurality of second brackets 62 and a plurality of third brackets 63. The first brackets 61 connect the outer sides of the electrodes 21, 22, 23, 24 facing towards the lead frame 201 to the corresponding inner surfaces of the lead frame 201. Two adjacent first electrodes 21, two adjacent second electrodes 22, two adjacent third electrodes 23 and two adjacent fourth electrodes 24 are respectively connected together by the second brackets 62. The third electrode 23 and the fourth electrode 24 of each electrode structure 20 are connected together by a corresponding third bracket 63.

Figure 6:
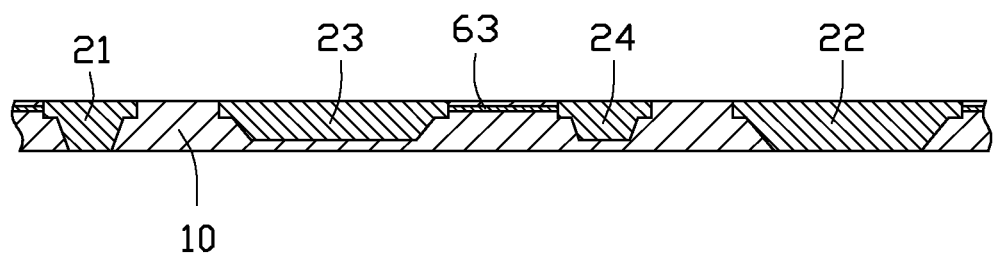

Referring to FIG. 6, the second step is forming a substrate 10 receiving the electrode structures 20 therein. In this embodiment, the substrate 10 is formed by molding. In this embodiment, the top surfaces of the first, second, third and fourth electrodes 21, 22, 23, 24 are exposed out of the top surface of the substrate 10. Bottom surfaces of the first and second electrodes 21, 22 are exposed out of the bottom surface of the substrate 10. Bottom surfaces of the third and fourth electrodes 23, 24 are received in the substrate 10 since the bottom surfaces of the third and fourth electrodes 23, 24 are located at level higher than that of the bottom surfaces of the first and second electrodes 21, 22.

Figure 7:
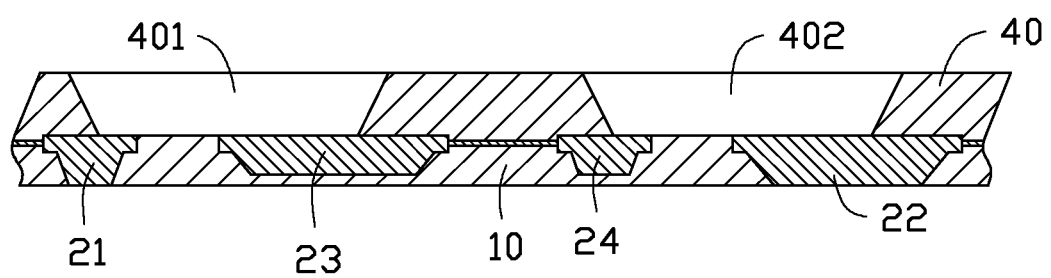

Referring to FIG. 7, the third step is forming a reflector 40 on the substrate 10 to cover the electrode structures 20. In this embodiment, each first through hole 401 is corresponding with the first and third electrodes 21, 23 of a corresponding electrode structure 20. A part of the top surface of the first electrode 21 is exposed at the bottom end of the first through hole 401, and a part of the top surface of the third electrode 23 is exposed at the bottom end of the first through hole 401 as well to support the first LED chip 31.

Similarly, each second through hole 402 is corresponding to the second and fourth electrodes 22, 24 of a corresponding electrode structure 20. A part of the top surface of the second electrode 22 is exposed at the bottom end of the second through hole 402; and a part of the top surface of the fourth electrode 24 is exposed at the bottom end of the second through hole 402 as well to support the second LED chip 32.

Figure 8:
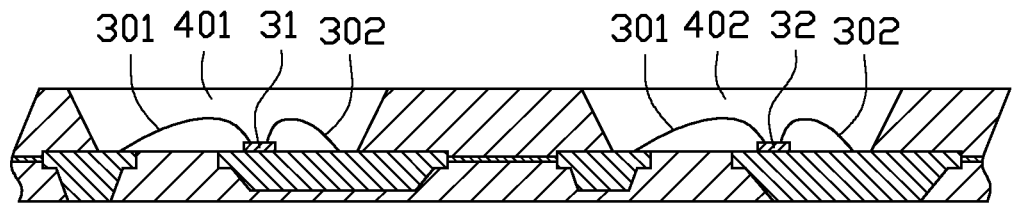

Referring to FIG. 8, the fourth step is providing the first LED chip 31 and the second LED chip 32, and mounting the first and second LED chips 31, 32 at bottoms of the through holes 401, 402, respectively. The first LED chip 31 is mounted on the top surface of the third electrode 23 and electrically connected to the first and third electrodes 21, 23 via the wires 301, 302. The second LED chip 32 is mounted on the top surface of the second electrode 22 and electrically connected to the second and fourth electrodes 22, 24 via the wires 301, 302.

Figure 9:
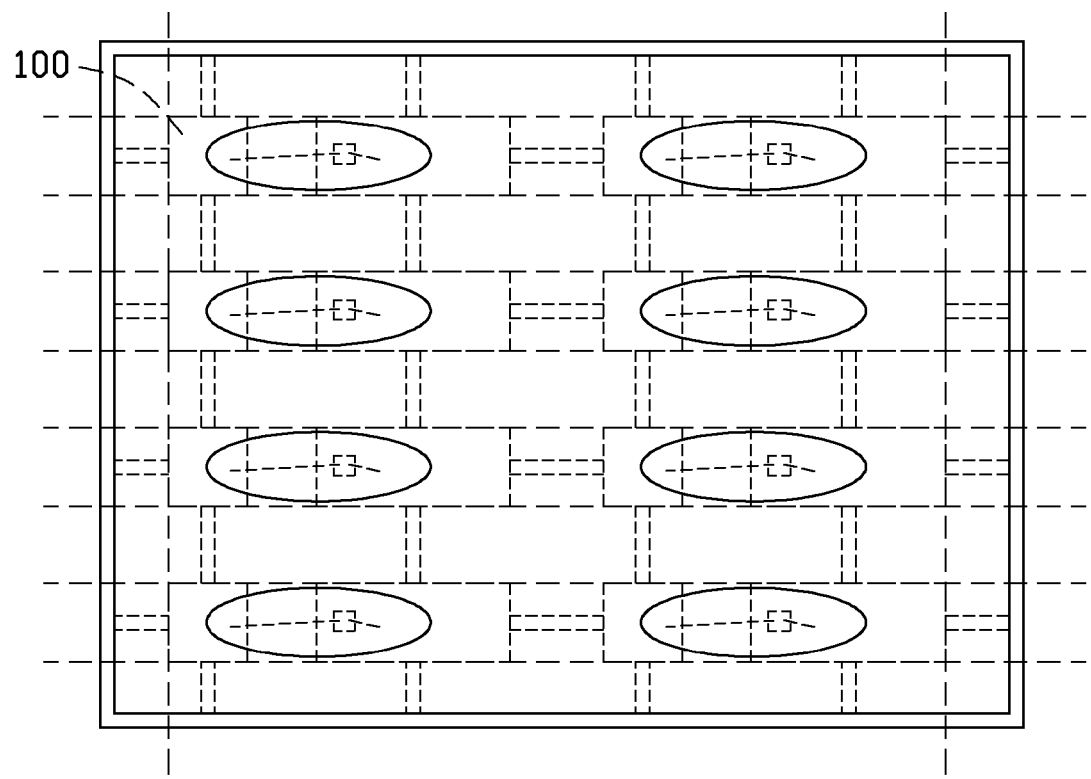

Referring to FIG. 9, the fifth step is cutting the engaging frame 200 and the substrate 10 to obtain a plurality of individual LED packages 100. In this embodiment, cutting the engaging frame 200 and the substrate 10 is performed along the dashed lines shown in FIG. 9 to form the LED packages 100 each being shown in FIGS. 1 and 2.

Alternatively, before the fifth step, phosphor-containing encapsulants can be injected in the through holes 401, 402 to respectively encapsulate the first and second LED chips 31, 32.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A light emitting diode (LED) package comprising:
   an electrically insulating substrate;
   an electrode structure embedded in the insulating substrate; and
   a plurality of LED chips electrically connecting with the electrode structure, the electrode structure comprising a first electrode, a second electrode and a third electrode located between the first and second electrodes, top surfaces of the first, second and third electrodes being exposed out of a top surface of the insulating substrate to support the LED chips, bottom surfaces of the first and second electrodes being exposed out of a bottom surface of the insulating substrate, a bottom surface of the third electrode being received in the substrate.

2. The LED package of claim 1, wherein bottom surfaces of the first and second electrodes are coplanar with the bottom surface of the insulating substrate.

3. The LED package of claim 2, wherein top surfaces of the first, second and third electrodes are coplanar with a top surface of the insulating substrate.

4. The LED package of claim 1, wherein the plurality of LED chips includes a first LED chip which is located on the top surface of the third electrode, and a second LED chip which is located on the top surface of the second electrode, the first LED chip electrically connects the first and third electrodes respectively via wires, and the second LED chip electrically connects with the second and third electrodes respectively via wires.

5. The LED package of claim 1, wherein each electrode comprises a main portion and a supporting portion extending from a central portion of a bottom surface of the main portion, and each electrode has a T-shape configuration in cross-section.

6. The LED package of claim 5, wherein a top surface of the main portion is the top surface of the each electrode and a bottom surface of the supporting portion is the bottom surface of the each electrode.

7. The LED package of claim 6, wherein the main portion is a rectangular board and the supporting portion is an inverted quadrangular frustum.

8. The LED package of claim 7, wherein a size of the supporting portion is gradually decreased from the top end connecting the bottom surface of the main portion to the bottom end away from the main portion.

9. The LED package of claim 1, further comprising a fourth electrode located between the second and third electrodes, and the fourth electrode is connected with the third electrode by a connecting bar.

10. The LED package of claim 9, wherein a bottom surface of the fourth electrode is located above the bottom surface of the insulating substrate, and is received in the substrate.

11. The LED package of claim 10, wherein a top surface of the fourth electrode is coplanar with the top surface of the insulating substrate, and is exposed out of the insulating substrate.

12. The LED package of claim 11, wherein the first LED chip is located on the top surface of the third electrode and electrically connects with the first and third electrodes respectively via wires, and the second LED chip is located on the top surface of the second electrode and electrically connects with the second and fourth electrodes respectively via wires.

13. The LED package of claim 12, wherein a reflector is located on the substrate, the reflector defines a first through hole and a second through hole, the first LED chip is located at a bottom end of the first through hole, and the second LED chip is located at a bottom end of the second through hole.

14. A method for manufacturing a light emitting diode (LED) package comprising:
   S1: providing an engaging frame, the engaging frame comprising a plurality of electrode structures arranged in rows along a height direction of the engaging frame, each electrode structure comprising a first electrode, a second electrode, a third electrode and a fourth electrode along a width direction of the engaging frame, the electrodes being spaced from each other, and the third and fourth electrodes being located between the first and second electrodes;
   S2: forming a substrate to enclose the electrode structures therein, wherein bottom surfaces of the first and second electrodes are exposed out of the bottom surface of the substrate and bottom surfaces of the third and fourth electrodes be received in the substrate;
   S3: forming a reflector on the substrate, the reflector defining a first through hole over the first and third electrodes and a second through hole over the second and fourth electrodes;
   S4: providing a first LED chip and a second LED chip, and mounting the first and second LED chips at bottoms of the first and second through holes, respectively, and electrically connecting the first LED chip with the first and third electrodes and the second LED chip with the second and four electrodes;
   S5: cutting the engaging frame and the substrate to obtain a plurality of individual LED packages each including a corresponding electrode structure and a corresponding first LED chip and a corresponding second LED chip.

15. The method of claim 14, further comprising a step S' between the step S4 and S5, and the step S' is performed by forming phosphor-containing layers in the first and second through holes respectively to cover the first and second LED chips.

16. The method of claim 14, wherein the engaging frame further comprises a rectangular lead frame and a plurality of connecting brackets connecting the electrode structures to the lead frame.

* * * * *